(12) United States Patent
Igarashi

(10) Patent No.: US 6,299,796 B1
(45) Date of Patent: Oct. 9, 2001

(54) STYRYL COMPOUND, METHOD FOR THE PREPARATION THEREOF AND ELECTROLUMINESCENT ELEMENT EMPLOYING THE SAME

(75) Inventor: Tatsuya Igarashi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/606,675

(22) Filed: Jun. 30, 2000

Related U.S. Application Data

(63) Continuation-in-part of application No. 09/209,423, filed on Dec. 11, 1998, now abandoned.

(30) Foreign Application Priority Data

Dec. 18, 1997 (JP) .................................................. 9-349733

(51) Int. Cl.$^7$ .......................... H05B 33/14; H05B 33/22; C09K 11/06
(52) U.S. Cl. ...................... 252/301.16; 726/670; 313/504
(58) Field of Search ....................... 252/301.16; 728/670; 313/507

(56) References Cited

U.S. PATENT DOCUMENTS

| 5,061,569 | 10/1991 | VanSlykke et al. | 25/301.16 |
| 5,777,070 | 7/1998 | Inbaseharan et al. | 252/301.16 |
| 5,821,002 | 10/1998 | Ohnishi et al. | 252/301.16 |

*Primary Examiner*—C. Melissa Koslow
(74) *Attorney, Agent, or Firm*—Sughrue, Mion, Zinn, Macpeak & Seas, PLLC

(57) ABSTRACT

Disclosed is an electroluminescent element comprising at least one compound containing at least one unit represented by formula (1):

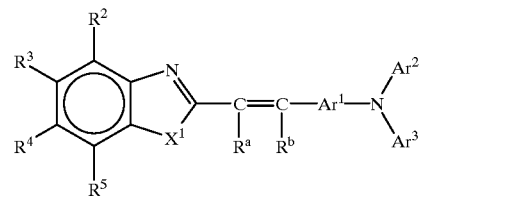

(1)

wherein $X^1$ represents an oxygen atom, a sulfur atom or $>NR^6$; $R^2$, $R^3$, $R^4$, $R^5$ and $R^6$, which are the same or different, each represents a hydrogen atom or a substituent, provided that at least one of $R^2$, $R^3$, $R^4$ and $R^5$ represents an aromatic group; $R^a$ and $R^b$, which are the same or different, each represents a hydrogen atom or a substituent; $Ar^1$ represents an aromatic linking group; and $Ar^2$ and $Ar^3$ each represents an aromatic group.

9 Claims, No Drawings

STYRYL COMPOUND, METHOD FOR THE PREPARATION THEREOF AND ELECTROLUMINESCENT ELEMENT EMPLOYING THE SAME

CROSS REFERENCE TO RELATED APPLICATION

This is a continuation-in-part application of Ser. No. 09/209,423 filed Dec. 11, 1998, now abandoned.

FIELD OF THE INVENTION

The present invention relates to a styryl compound, a method for the preparation thereof, and an electroluminescent (EL) element comprising the same.

BACKGROUND OF THE INVENTION

Recently, investigation and development on various display elements have been actively made. Among others, organic electroluminescent (EL) elements are being watched as promising display elements since they can emit high-luminance luminescence at a low driving voltage. For instance, an organic EL element having a thin layer formed by vapor deposition of an organic compound is known as described in *Applied Physics Letters*, Vol. 51, page 913 (1987). The organic EL element described therein has a laminated layer structure of an electron-transporting material and a hole-transporting material, and its luminescent characteristics are greatly improved in comparison with conventional EL elements of single layer type.

In order to improve luminescent efficiency of the EL element of laminated type described above, a method of doping a fluorescent dye is known. For example, an organic EL element doped with a coumarin dye described in *Journal of Applied Physics*, Vol. 65, page 3610 (1989) exhibits remarkably improved luminescent efficiency as compared with an organic EL element without doping (non-doped type element). However, the doped element is inferior in production aptitude, for example, because it is necessary to control the dope amount subtly. Accordingly, it was desired to develop a non-doped type element that emits highly efficiently.

In the field of organic EL elements, color of luminescence requested may be varied and it is possible to obtain light having the desired wavelength by changing the kind of fluorescent dye to be employed.

However, only a small number of fluorescent dyes emitting blue to blue-green light which emits highly efficiently light having the desired wavelength and have good durability are known, and a further development has been desired.

SUMMARY OF THE INVENTION

Objects of the present invention are to provide a compound which emits light having a wavelength in a blue to blue-green region and has excellent durability, a method for the preparation thereof, and an electroluminescent element containing the same.

Other objects of the present invention will become apparent from the following description and examples.

The above described objects of the present invention are accomplished by the following.

(A) An electroluminescent element comprising at least one compound containing at least one unit represented by formula (1):

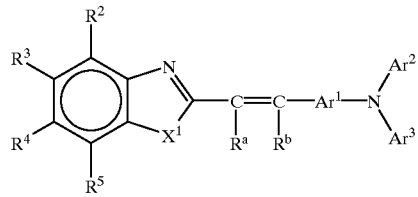

wherein $X^1$ represents an oxygen atom, a sulfur atom or >$NR^6$; $R^2$, $R^3$, $R^4$, $R^5$ and $R^6$, which are the same or different, each represents a hydrogen atom or a substituent, provided that at least one of $R^2$, $R^3$, $R^4$ and $R^5$ represents an aromatic group; $R^a$ and $R^b$, which are the same or different, each represents a hydrogen atom or a substituent; $Ar^1$ represents an aromatic linking group; and $Ar^2$ and $Ar^3$ each represents an aromatic group.

(B) An electroluminescent element as described in (A) wherein, in formula (1), $R^3$ is an aryl group, and $R^a$ and $R^b$ each represents a hydrogen atom.

(C) An electroluminescent element as described in (A), wherein, in formula (1), $R^4$ is an aryl group, and $R^a$ and $R^b$ each represents a hydrogen atom.

(D) A high molecular weight compound comprising a partial skeleton represented by formula (2) in the polymer main chain:

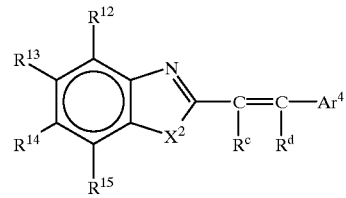

wherein $X^2$ represents an oxygen atom, a sulfur atom or >$NR^{16}$; $R^{12}$, $R^{13}$, $R^{14}$, $R^{15}$ and $R^{16}$, which are the same or different, each represents a hydrogen atom or a substituent, provided that at least one of $R^{12}$, $R^{13}$, $R^{14}$, $R^{15}$ and $R^{16}$ represents an aromatic group; $R^c$ and $R^d$, which are the same or different, each represents a hydrogen atom or a substituent; and $Ar^4$ represents an aromatic group.

(E) An electroluminescent element comprising at least one high molecular weight compound comprising a partial skeleton represented by formula (2) in the polymer main chain, as described in (D).

(F) An electroluminescent element as described in (A), (B), (C) or (E), which is non-doped type.

DETAILED DESCRIPTION OF THE INVENTION

The compound containing at least one unit represented by the formula (1) will be described in greater detail below.

In the formula (1), $X^1$ represents an oxygen atom, a sulfur atom or >$NR^6$ wherein $R^6$ represents a hydrogen atom or a substituent. Examples of the substituent represented by $R^6$ include an alkyl group (having preferably from 1 to 20, more preferably from 1 to 12, particularly preferably from 1 to 8 carbon atom, e.g., methyl, ethyl, isopropyl, tert-butyl, n-octyl, n-decyl, n-hexadecyl, cyclopropyl, cyclopentyl, and cyclohexyl), an alkenyl group (having preferably from 2 to 20, more preferably from 2 to 12, particularly preferably from 2 to 8 carbon atoms, e.g., vinyl, allyl, 2-butenyl, and 3-pentenyl), an alkynyl group (having preferably from 2 to 20, more preferably from 2 to 12, particularly preferably from 2 to 8 carbon atoms, e. g., propargyl and 3-pentynyl), an aryl group (having preferably from 6 to 30, more preferably from 6 to 20, particularly preferably from 6 to 12 carbon atoms, e.g., phenyl, p-methylphenyl, and naphthyl), a substituted carbonyl group (having preferably from 1 to 40, more preferably from 1 to 20, more preferably from 1 to 12 carbon atoms, e.g., acetyl, benzoyl, methoxycarbonyl, dimethyl-aminocarbonyl, and phenylaminocarbonyl), a substituted sulfonyl group (having preferably from 1 to 20, more preferably from 1 to 16, particularly preferably from 1 to 12 carbon atoms, e.g., mesyl, and tosyl) and a heterocyclic group (which contains one or more-hetero atoms, for example, a nitrogen atom, an oxygen atom and a sulfur atom and has preferably from 1 to 20, more preferably from 1 to 16, particularly preferably from 1 to 12 carbon atoms, e.g., imidazolyl, pyridyl, furyl, and piperidyl). These substituents may be further substituted. $R^6$ is preferably a hydrogen atom, an alkyl group or an aryl group, and particularly preferably a hydrogen atom or an alkyl group.

$X^1$ is preferably an oxygen atom or a sulfur atom, and particularly preferably an oxygen atom.

$Ar^1$ represents an aromatic linking group, and $Ar^2$ and $Ar^3$ each represents an aromatic group. Examples of $Ar^1$ include an arylene group (preferably having 6 to 50 carbon atoms, more preferably having 6 to 30 carbon atoms, particularly preferably 6 to 12 carbon atoms, for example, phenylene group, naphthylene group, anthrylene group), and a heteroarylene group (preferably 1 to 50 carbon atoms, more preferably 1 to 30 carbon atoms, particularly preferably 2 to 12 carbon atoms, for example, pyridylene group, quinolylene group, thienylene group, carbazolylene group, oxadiazolylene group). These groups may be further substituted.

Examples of $Ar^2$ and $Ar^3$ include an aryl group (preferably having 6 to 50 carbon atoms, more preferably 6 to 30 carbon atoms, particularly preferably 6 to 12 carbon atoms, for example, phenyl group, naphthyl group, anthryl group) and an aromatic heterocyclic group (preferably having 1 to 50 carbon atoms, more preferably 1 to 30 carbon atoms, particularly preferably 2 to 12 carbon atoms, for example, pyridyl group, quinolyl group, thienyl group, carbazolyl group, oxadiazolyl group). These groups may be further substituted.

$Ar^1$ is preferably a substituted or unsubstituted arylene group, more preferably a substituted or unsubstituted phenylene, naphthylene or anthrylene group, particularly preferably a substituted or unsubstituted phenylene group.

$Ar^2$ and $Ar^3$ each preferably represents a substituted or unsubstituted aryl group, more preferably a substituted or unsubstituted phenyl, naphthyl, anthryl, phenanthryl, pyrenyl group, particularly preferably a substituted or unsubstituted naphthyl, anthryl, phenanthryl or pyrenyl group. $R^2$, $R^3$, $R^4$ and $R^5$, which may be the same or different, each represents a hydrogen atom or a substituent, and at least one of $R^2$, $R^3$, $R^4$ and $R^5$ represents an aromatic group. Examples of the aromatic group are the same as those described for $Ar^2$ above. Examples of the substituent include an alkyl group (having preferably from 1 to 20, more preferably from 1 to 12, particularly preferably from 1 to 8 carbon atoms, e.g., methyl, ethyl, isopropyl, tert-butyl, n-octyl, n-decyl, n-hexadecyl, cyclopropyl, cyclopentyl, and cyclohexyl), an alkenyl group (having preferably from 2 to 20, more preferably from 2 to 12, particularly preferably from 2 to 8 carbon atoms, e.g., vinyl, allyl, 2-butenyl, and 3-pentenyl), an alkynyl group (having preferably from 2 to 20, more preferably from 2 to 12, particularly preferably from 2 to 8 carbon atoms, e.g., propargyl and 3-pentynyl), an aryl group (having preferably from 6 to 30, more preferably from 6 to 20, particularly preferably from 6 to 12 carbon atoms, e.g., phenyl, p-methylphenyl, and naphthyl), a substituted carbonyl group (having preferably from 1 to 20, more preferably from 1 to 16, particularly preferably from 1 to 12 carbon atoms, e.g., acetyl, benzoyl, methoxycarbonyl, phenyloxycarbonyl, dimethylaminocarbonyl, and phenylaminocarbonyl), a substituted amino group (having preferably from 1 to 20, more preferably from 1 to 16, particularly preferably from 1 to 12 carbon atoms, e.g., dimethylamino, methylcarbonylamino, ethylsulfonylamino, dimethylaminocarbonylamino, and phthalimido), a substituted sulfonyl group (having preferably from 1 to 20, more preferably from 1 to 16, particularly preferably from 1 to 12 carbon atoms, e.g., mesyl, and tosyl), a sulfo group, a carboxy group, a heterocyclic group (which contains one or more hetero atoms, for example, a nitrogen atom, an oxygen atom and a sulfur atom and has preferably from 1 to 20, more preferably from 1 to 16, particularly preferably from 1 to 12 carbon atoms, e.g., imidazolyl, pyridyl, furyl, piperidyl, morpholino, benzoxazolyl, andtriazolyl), ahyroxy group, an alkoxy group (havingpreferably from 1 to 20, more preferably from 1 to 16, particularly preferably from 1 to 12 carbon atoms, e.g., methoxy, and benzyloxy), an aryloxy group (having preferably from 6 to 20, more preferably from 6 to 16, particularly preferably from 6 to 12 carbon atoms, e.g., phenoxy, and naphthyloxy), a halogen atom (preferably, fluorine, chlorine, bromine and iodine), a thiol group, an alkylthio group (having preferably from 1 to 20, more preferably from 1 to 16, particularly preferably from 1 to 12 carbon atoms, e.g., methylthio), an arylthio group (having preferably from 6 to 20, more preferably from 6 to 16, particularly preferably from 6 to 12 carbon atoms, e.g., phenylthio) and a cyano group. These substituents may be further substituted.

$R^2$ and $R^5$ each is preferably a hydrogen atom, an alkyl group, an aryl group, a heterocyclic group, a halogen atom or an alkoxy group, more preferably a hydrogen atom or an aryl group, and particularly preferably a hydrogen atom.

$R^3$ and $R^4$ each is preferably a hydrogen atom, an alkyl group, an aryl group, a heterocyclic group, a halogen atom or an alkoxy group, more preferably a hydrogen atom, an aryl group or an aromatic heterocyclic group, and particularly preferably a hydrogen atom or a phenyl group.

$R^a$ and $R^b$, which may be the same or different, each represents a hydrogen atom or a substituent. Examples of the substituent include an alkyl group (having preferably from 1 to 20, more preferably from 1 to 12, particularly preferably from 1 to 8 carbon atoms, e.g., methyl, ethyl, isopropyl, tert-butyl, n-octyl, n-decyl, n-hexadecyl, cyclopropyl, cyclopentyl, and cyclohexyl), an aryl group (having preferably from 6 to 30, more preferably from 6 to 20, particularly preferably from 6 to 12 carbon atoms, e.g., phenyl, p-methylphenyl, and naphthyl), a heterocyclic group (which contains one or more hetero atoms, for example, a nitrogen atom, an oxygen-atom and a sulfur atom and has preferably from 1 to 20, more preferably from 1 to 16, particularly preferably from 1 to 12 carbon atoms, e.g., imidazolyl, pyridyl, furyl, and piperidyl) and a cyano group. $R^a$ and $R^b$ each is preferably a hydrogen atom.

The compound containing at least one unit represented by the formula (1) may include a low molecular weight compound, a high molecular weight compound in which the unit represented by the formula (1) is connected to its polymer main chain (having a weight average molecular weight of preferably from 1,000 to 5,000,000, more preferably from 5,000 to 2,000,000, and particularly preferably from 10,000 to 1,000,000), and a high molecular weight compound containing the unit represented by the formula (1) in its main chain (having a weight average molecular weight of preferably from 1,000 to 5,000,000, more preferably from 5,000 to 2,000,000, and particularly preferably from 10,000 to 1,000,000). In case of the high molecular weight compounds, they may be homopolymers or copolymers containing other monomer units.

The compound containing the unit represented by the formula (1) is preferably a low molecular weight compound or a high molecular weight compound containing the unit represented by the formula (1) in its main chain, and more preferably a conjugated high molecular weight compound containing the unit represented by the formula (1) in its main chain.

The high molecular weight compound having a partial skeleton represented by formula (2) in the polymer main chain is explained below.

The high molecular weight compound of the present invention is a high molecular weight compound having a partial skeleton represented by formula (2) in the polymer main chain, and is not a compound having a partial skeleton represented by formula (2) at the polymer end.

Formula (2) is explained below. $X^2$ represents an oxygen atom, a sulfur atom, or $>NR^{16}$ group. $R^{12}$ to $R^{16}$ each represents a hydrogen atom or a substituent, provided that at least one of $R^{12}$ to $R^{16}$ is an aromatic group. Examples of the substituent of $R^{12}$ to $R^{16}$ and its preferred examples are the same as those of the above $R^2$ to $R^6$. $R^c$ and $R^d$ each represents a hydrogen atom or a substituent. Examples of the substituent of $R^c$ and $R^d$ and its preferred examples are the same as those of the above $R^a$ and $R^b$.

$Ar^4$ represents an aromatic group. Examples of the aromatic group includes the groups explained for the above $Ar^2$. $Ar^4$ is preferably a substituted or unsubstituted aryl group, more preferably an aryl group substituted by a nitrogen atom.

The high molecular weight compound comprising a partial skeleton represented by formula (2) in the polymer main chain preferably has a weight average molecular weight of 1,000 to 5,000,000, more preferably 5,000 to 2,000,000, particularly preferably 10,000 to 1,000,000. The high molecular weight compound comprising a partial skeleton represented by formula (2) in the polymer main chain may be homopolymer or a copolymer with another monomer.

Specific examples of the present compound are set forth below, but the present invention should not be construed as being limited thereto.

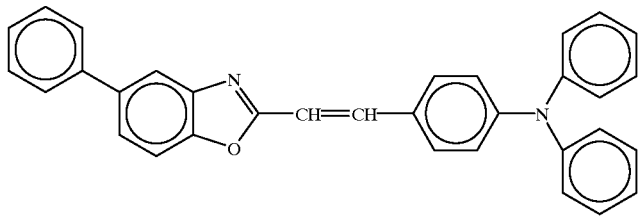

(I-1)

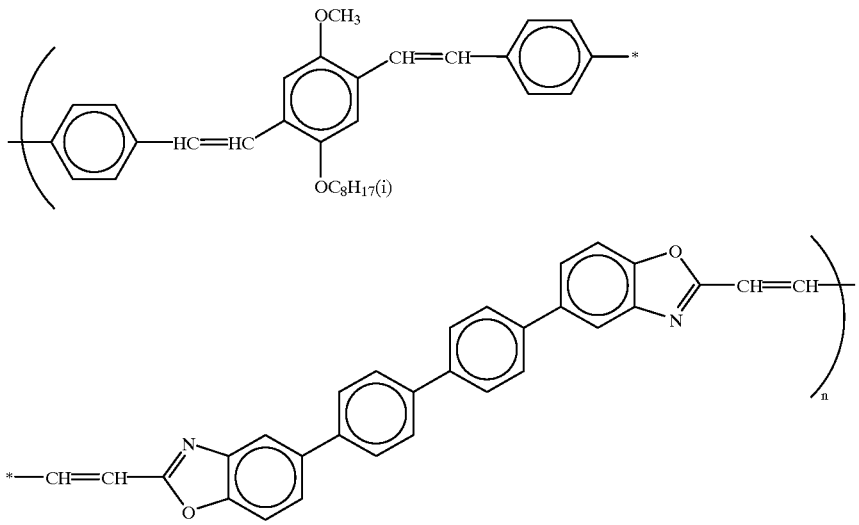

(I-2)

Polystyrene conversion: Mw = 4,700

-continued
(I-3)
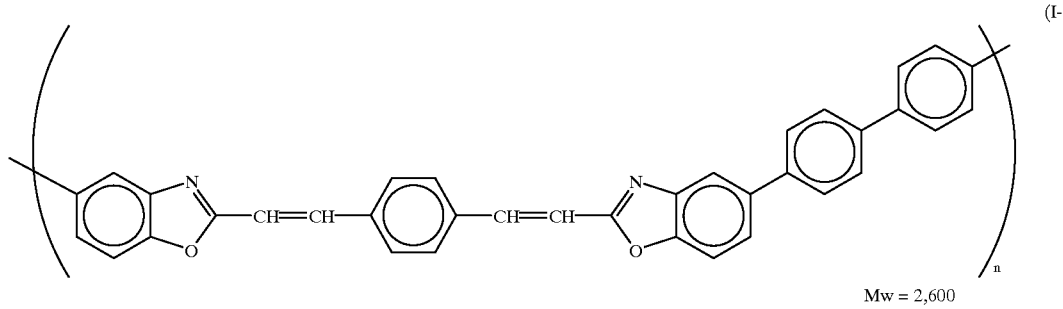
(I-4)
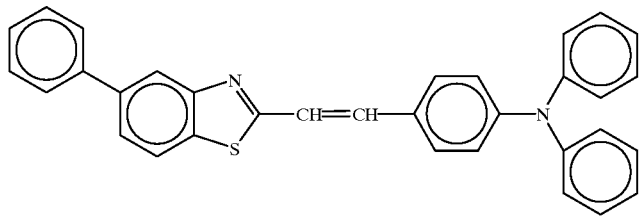
(I-5)
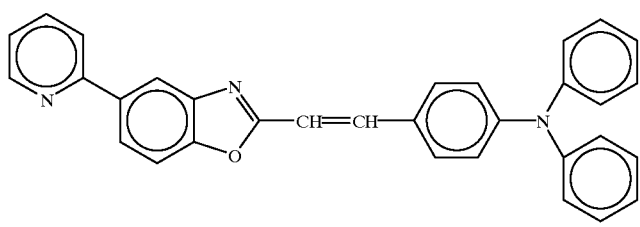
(I-6)
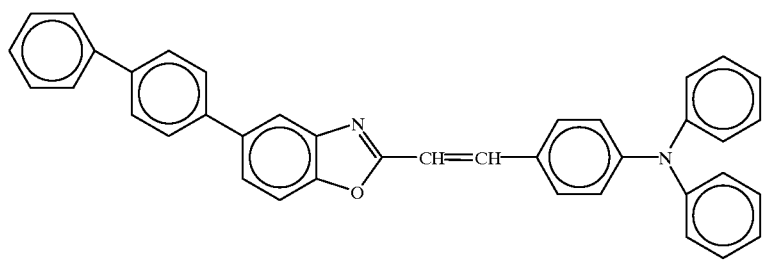
(I-7)
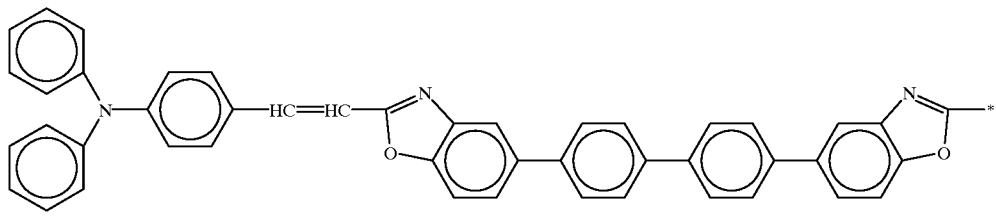
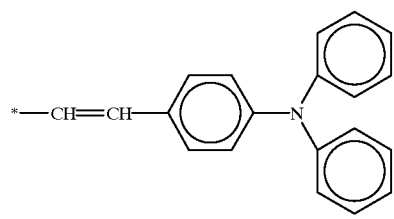

(I-8)
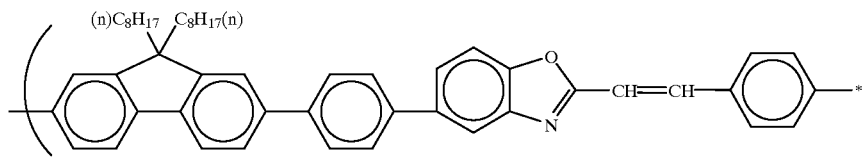
Mw: 7,900
(I-9)
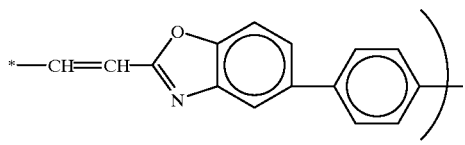
(I-10)
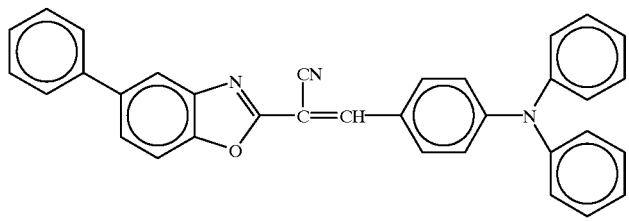
(I-11)
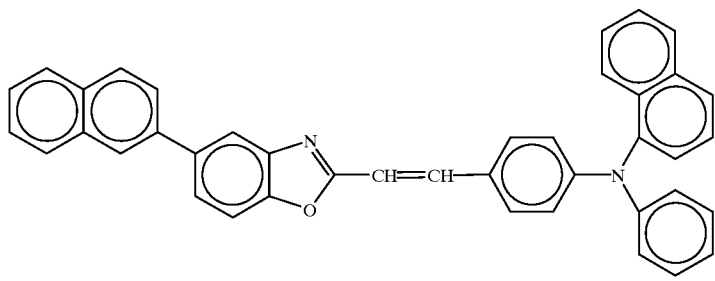
(I-12)
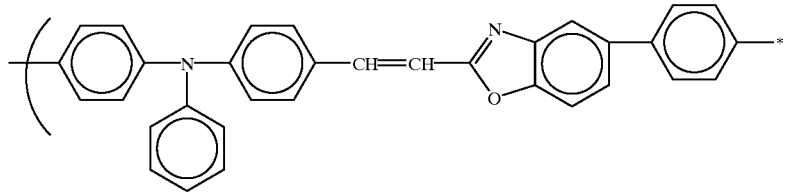
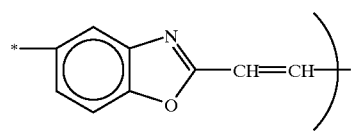
Mw: 5,300

-continued

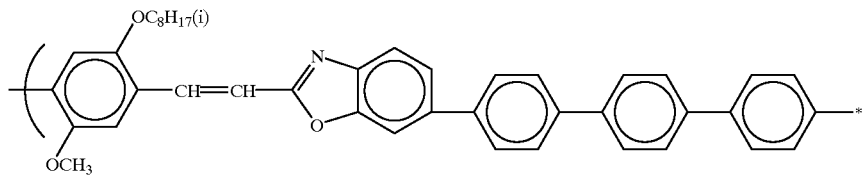
(I-13)

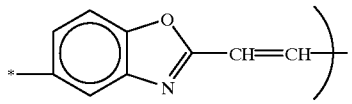

Mw: 7,700

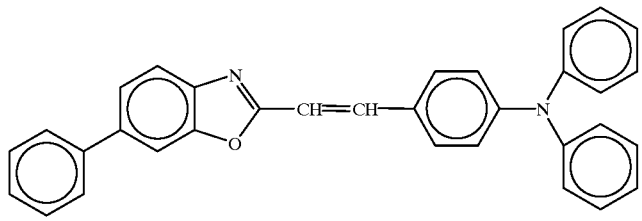
(I-14)

Now, a method for the preparation of the the compound of the present invention is described in detail below.

The compound of the present invention can be prepared according to various method. For example, there are a method containing a step of a homo-coupling reaction of an aryl halide in the presence of a nickel or copper derivative, a method containing a step of a coupling reaction of an aryl halide a-derivative with a vinyl benzene derivative in the presence of a palladium catalyst. However, a method containing a step of a coupling reaction of a boric acid derivative or boric ester derivative with an aryl halide derivative or aryl triflate derivative in the presence of a palladium catalyst is preferred. A method using the boric acid derivative and the aryl halide derivative is more preferred. Suitable examples of the boric acid derivative include substituted or unsubstituted aryl boric acid derivatives (e.g., phenyl boric acid, p-fluorophenyl boric acid, 1,4-phenyl diboric acid, 4,4'-biphenyl diboric acid, and naphthyl boric acid), heteroaryl boric acid derivatives (e.g., pyridyl boric acid), and compounds having one or more boric acid groups in at least one of $R^2$, $R^3$, $R^4$ and $R^5$ in the formula (1) or at least one of $R^{12}$, $R^{13}$, $R^{14}$ and $R^{15}$ in the formula (2). Suitable examples of the boric ester derivative include substituted or unsubstituted aryl boric ester derivatives (e.g., pinacol ester of phenyl boric acid), heteroaryl boric ester derivatives (e.g. pinacol ester of pyridyl boric acid), and compounds having one or more boric ester groups in at least one of $R^2$, $R^3$, $R^4$ and $R^5$ in the formula (1) or at least one of $R^2$, $R^3$, $R_4$ $R^{13}$, $R^{14}$ and $R^{15}$ in the formula (2).

In the aryl halide derivatives, halogen atoms are preferably chlorine, bromine or iodine atoms, and more preferably bromine atoms. Suitable examples of the aryl halide derivative include compounds having one or more halogen atom-containing groups (e.g., bromine atom, and bromophenyl) in at least one of $R^2$, $R^3$, $R^4$ and $R^5$ in the formula (1) or at least one of $R^{12}$, $R^{13}$ $R^{14}$ and $R^{15}$ in the formula (2), bromobenzene, dibromobenzene, and dibromobiphenyl. Suitable examples of the aryl triflate derivative include compounds having one or more trifluoromethanesulfonyl groups (eg., trifluoromethanesulfonyl and trifluoromethanesulfonylphenyl) in at least one of $R^2$, $R^3$, $R^4$ and $R^5$ in the formula (1) or at least one of $R^{12}$, $R^{13}$, $R^{14}$ and $R^{15}$ in the formula (2), trifluoromethanesulfonylbenzene, and ditrifluoromethanesulfonylbenzene.

The palladium catalyst is not particularly limited. Suitable examples of the palladium catalyst include palladium tetrakistriphenyl phosphine, palladium carbon, and palladiun dichloride (dppf). A ligand such as triphenyl phosphine may be simultaneously added.

The reaction is preferably conducted by using a base. The base to be used is not particularly limited. Suitable examples of the base include, for example, sodium carbonate, sodium acetate, and triethylamine. The amount of the base used is also not particularly limited. The amount is preferably from 0.1 to 20, more preferably from 1 to 10 equivalent per the boric acid or ester group used. The term equivalent used herein means that the mole number of the boric acid or ester group is equal to the mole number of the base used.

In the reaction, a solvent is preferably employed. The solvent to be used is not particularly limited. Suitable examples of the solvent include ethanol, water, ethyleneglycol dimethyl ether, diethyleneglycol dimethyl ether, dimethylformamide, toluene and a mixture thereof.

Now, the EL element comprising the styryl compound according to the present invention will be described in detail below.

Methods for forming an organic layer of the EL element containing the styryl compound according to the present invention are not particularly limited. However, vapor deposition with resistance heating, electron beams, sputtering, molecular-layer accumulation, a coating method, a printing method, inkjet method, and the like may be employed. Among them, the vapor deposition with resistance heating and coating method are preferred from the standpoints of properties and production.

The luminescent element of the present invention comprises a pair of electrodes, i.e., an anode and a cathode, and formed therebetween either a luminescent layer or plural thin organic-compound layers containing a luminescent layer. Besides the luminescent layer, the element may have a hole-injecting layer, a hole-transporting layer, an electron-injecting layer, an electron-transporting layer and a protective layer. Each of these layers may have one or more other functions. Each layer can be constituted of various materials.

The anode serves to feed holes to the hole-injecting layer, hole-transporting layer, luminescent layer, etc. It can be made of a metal, an alloy, a metal oxide, an electroconductive compound, a mixture of two or more thereof, or the like, and is preferably made of a material having a work function of 4 eV ox higher. Specific examples of such anode materials include an electroconductive metal oxide such as tin oxide, zinc oxide, indium oxide, and indium-tin oxide (hereinafter referred to as "ITO"); a metal such as gold, silver, chlorium, and nickel; a mixture or a multilayer structure each comprising one or more of those metals and one or more of those electroconductive metal oxides; an inorganic electroconductive substance such as copper iodide and copper sulfide; an organic electroconductive material such as polyaniline, polythiophene, and polypyrrole; and a multilayer structure comprising one or more of these materials and ITO. Preferred of these are electroconductive metal oxides. In particular, ITO is preferred form the standpoints of productivity, high electrical conductivity, transparency, etc. Although the thickness of the anode can be appropriately selected depending on the material thereof, it is ordinarily preferably from 10 nm to 5 $\mu$m, more preferably from 50 nm to 1 $\mu$m, and still more preferably from 100 nm to 500 nm.

In general, an anode layer for use in the luminescent element is formed on a substrate, e.g., a soda-lime glass, alkali-free glass, or transparent resin substrate. In the case where a glass is used, the glass is preferably an alkali-free glass for the purpose of diminishing ion dissolution from the glass. In the case of using a soda-lime glass, it preferably has a barrier coat comprising, e.g., silica. The thickness of the substrate is not particularly limited as long as it is sufficient for maintaining a mechanical strength. However, in the case of using a glass, the thickness thereof is generally 0.2 mm or larger, preferably 0.7 mm or larger.

For the production of the anode, various methods can be used depending on materials. For example, in the case of ITO, a film thereof is formed by an electron beam method, sputtering, vapor deposition with resistance heating, a chemical reaction method (sol-gel method), or coating with an indium-tin oxide dispersion.

Cleaning or other treatment of the anode is effective in lowering the driving voltage of the element or heightening the efficiency of luminescence. In the case of ITO, for example, UV-ozone treatment or plasma treatment is effective.

The cathode serves to feed electrons to the electron-injecting layer, electron-transporting layer, luminescent layer, etc. Adhesion to a layer adjacent to the negative electrode, e.g., the electron-injecting layer, electron-transporting layer, or luminescent layer, ionization potential, stability, and others are taken in account when selecting a cathode. The cathode can be made of a material such as a metal, an alloy, a metal halide, a metal oxide, an electroconductive compound, or a mixture of two or more thereof. Specific examples of such cathode materials include an alkali metal (e.g., Li, Na, and K) or its fluoride, an alkaline earth metal (e.g., Mg and Ca) or its fluoride, gold, silver, lead, aluminum, a sodium-potassium alloy or a mixture of the metals, a lithium-aluminum alloy or a mixture of the metals, a magnesium-silver alloy or a mixture of the metals, and a rare earth metal such as indium and ytterbium. Preferred of these are the materials having a work function of 4 eV or lower. More preferred are aluminum, a lithium-aluminum alloy or a mixtures of the metals, a magnesium-silver alloy or a mixture of the metals, and the like. The cathode may have a multilayer structure containing the above described compounds and mixtures as well as a single-layer structure of the above described compounds and mixtures. Although the thickness of the cathode can be appropriately selected depending on the material thereof, it is ordinarily preferably from 10 nm to 5 $\mu$m, more preferably from 50 to 1 $\mu$m, and still more preferably from 100 nm to 1 $\mu$m.

For the production of the cathode, a method such as an electron beam method, sputtering, vapor deposition with resistance heating, or coating is used. It is possible to vapor-deposit an elemental metal or to simultaneously vapor-deposit two or more ingredients. It is also possible to simultaneously vapor-deposit two or more metals to form an alloy electrode. Alternatively, an alloy prepared beforehand may be subjected to vapor deposition.

The anode and the cathode each preferably has a lower sheet resistance, specifically several hundreds $\Omega/\square$ or lower.

The luminescent layer may be made of any material capable of forming a layer which not only has such a function that upon application of an electric field, holes can be injected thereinto from the anode or form the hole-injecting or hole-transporting layer and, at the same time, electrons can be injected thereinto from the cathode or from the electron-injecting or electron-transporting layer, but also functions to allow the injected charges to move therethrough and functions to provide a place where holes recombine with electrons to cause luminescence. Although the luminescent layer preferably contains the styryl compound according to the present invention, a luminescent material other than the styryl compound according to the present invention may be used. Examples of such other luminescent materials include benzoxazole derivatives, benzimidazole derivatives, benzothiazole derivatives, sytrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyrralidine derivatives, cyclopentadiene derivatives, bis-styrylanthracene derivatives, quinacridone derivatives, pyrrolopyridine derivatives, thiadiazolopyridine derivatives, styrylamine derivatives, aromatic dimethylidyne compounds, various metal complexes represented by metal complexes and rare-earth complexes of 8-quinolinol derivatives, and polymeric compounds such as polythiophene, polyphenylene, and polyphenylenevinylene. Although the thickness of the luminescent layer is nort particularly limited, it is ordinarily preferably from 1 nm to 5 $\mu$m, more preferably from 5 nm to 1 $\mu$m, still more preferably from 10 nm to 500 nm.

Methods for forming the luminescent layer are not articularly limited. Suitable methods include vapor deposition with resistance heating, an electron beam method, sputtering, molecular-layer accumulation, a coating method (e.g., spin coating, casting, and dip coating), printing method, inkjet method and an LB (Langmuir Blodgett) method. Among them, the vapor deposition with resistance heating and coating method are preferred.

The hole-injecting layer and the hole-transporting layer each may be made of any material which has such a function that holes can be injected thereinto from the anode or which functions to transport holes or to barrier the electrons injected form the cathode. Examples of such materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene. derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electroconductive high-molecular oligomers such as thiophene oligomers and polythiophene, and the styryl compound according to the present invention. Although the thicknesses of the hole-injecting layer and hole-transporting layer are not particularly limited, they are ordinarily preferably from 1 nm to 5 $\mu$m, more preferably from 5 nm to 1 $\mu$m, still more preferably from 10 nm to 500 nm, respectively. The hole-injecting layer and the hole-transporting layer each may have a single-layer structure consisting of one or more of the materials described above, or may have a multilayer structure composed of two or more layers having the same or different compositions.

Methods for forming the hole-injecting layer and the hole-transporting layer include vapor deposition, an LB method, and a coating method in which a solution or dispersion of any of the above described hole-injecting/transporting agents in a solvent (e.g., by spin coating, casting, dip coating, printing method, or inkjet method) is applied. In the case of the coating method, the active ingredient can be dissolved or dispersed together with a resin ingredient. Suitable examples of the resin ingredient include poly(vinyl chloride), polycarbonates, polystyrene, poly(methyl methacrylate), poly(butyl methacrylate), polyesters, polysulfones, poly (phenylene oxide) s, polybutadiene, poly(N-binylcarbazole), hydrocarbon resins, ketone resins, phenoxy resins, polyamides, ethyl cellulose, poly (vinyl acetate), ABS resins, polyurethanes, melamine resins, unsaturated polyester resins, alkyd resins, epoxy resins, and silicone resins.

The electron-injecting layer and the electron-transporting layer each may be made of any material which has such a function that electrons can be injected thereinto from the cathode or which functions to transport electrons or to barrier the holes injected form the anode. Examples of such materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, heterocyclic compounds with tetracarboxylic anhydrides, e.g., naphthalene perillene, phthalocyanine derivatives, and various metal complexes represented by metal complexes of 8-quinolinol derivatives, metal phthalocyanines, metal complexes containing benzoxazole or benzothiazole as a ligand, and the styryl compound according, to the present invention. Although the thicknesses of thet electron-injecting layer and electron-transporting layer are not particularly limited, they are ordinarily preferably from 1 nm to 5 $\mu$m, more preferably from 5 nm to 1 $\mu$m, still more preferably from 10 nm to 500 nm, respectively. The electron-injecting layer and the electron-transporting layer may have a single-layer structure consisting of one or more of the materials described above, or may have a multilayer structure composed of two or more layers having the same or different compositions.

Methods for forming the electron-injecting layer and the electron-transporting layer include vapor deposition, an LB method, and a coating method in which a solution or dispersion of any of the above described electron-injecting/transporting agents in a solvent (e.g., by spin coating, casting, dip coating, printing method, or inkjet method) is applied. In the case of the coating method, the active ingredient can be dissolved or dispersed together with a resin ingredient. Suitable examples of the resin ingredient are the same as those described hereinabove with regard to the hole-injecting/transporting layer.

The protective layer may be made of any material which functions to inhibit any substance which accelerates element deterioration, e.g., water or oxygen, from coming into the element. Examples of such materials include a metal such as In, Sn, Pb, Au, Cu, Ag, Al, Ti, and Ni, a metal oxide such as MgO, SiO, $SiO_2$, $Al_2O_3$, GeO, NiO, CaO, BaO, $Fe_2O_3$, $Y_2O_3$, and $TiO_2$, a metal fluoride such as $MgF_2$, LiF, $AlF_3$, and $CaF_2$, polyethylene, polypropylene, poly(methyl methacrylate), polyimides, polyureas, polytetrafluorethylene, polychlorotrifluoroethylene, polydichlorodifluoroethylene, a copolymer of chlorotrifluoroethylene and dichlorodifluoroethylene, a copolymer obtained by copolymerizing a monomer mixture comprising tetrafluoroethylene and at least one comonomer, a fluorinated copolymer comprising a copolymer backbone having one or more ring structures, a water-absorbing substance having a water absorption of 1% or higher, and a moisture barrier substance having a water absorption of 0.1% or lower.

Methods for forming the protective layer are also not particularly limited. Suitable methods include vacuum vapor deposition, sputtering, reactive sputtering, MBE (molecular-beam epitaxy), a cluster ion beam method, ion plating, plasma polymerization (high-frequency excitation ion plating), plasma-assisted CVD, laser-assisted CVD, heat-assisted CVD, and gas-source CVD.

The present invention will be explained in more detail with reference to the following examples, but the present invention should not be construed as being limited thereto.

EXAMPLE 1

Synthesis of Compound (1-1)

Into 50 ml of ethyleneglycol were dissolved 7.6 g of benzoxazole derivative (Compound (1) shown below) and 10 g of formylaniline derivative (Compound (2) shown below). To the solution was added 4.1 g of potassium tert-butoxide, and the solution was refluxed by heating for 8 hours with stirring. After cooling to room temperature, 150 ml of isopropanol was added to the reaction mixture, and the solid deposited was separated by filtration. The crude product was crystallized from ethyl acetate to obtain 5.2 g of Compound (1-1) as yellow solid.

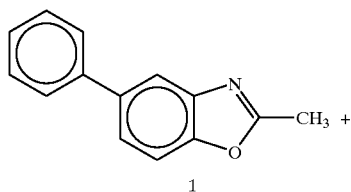

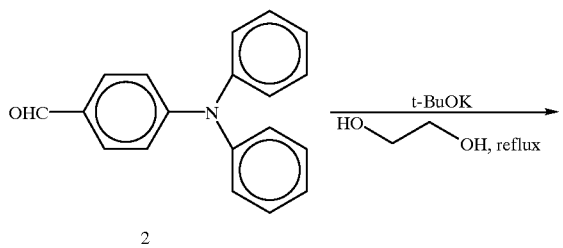

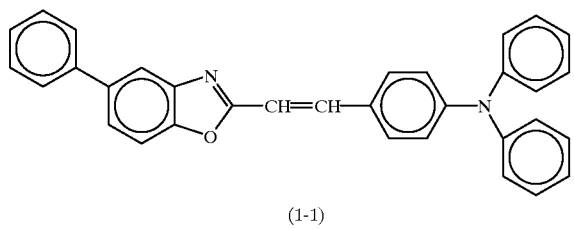

EXAMPLE 2

Synthesis of Compound (1-3)

To a mixture of 0.38 g of dibromo derivative (Compound (3) shown below) and 0.2 g of 4,4'-biphenyldiboric acid (Compound (4) shown below) were added 6 ml of diethyleneglycol dimethyl ether, 2.5 ml of water, 0.03 g of triphenyl phosphine, 0.5 g of sodium carbonate and 0.1 g of palladium carbon and the solution, was refluxed by heating for 12 hours with stirring. The solid deposited was separated by filtration and washed with chloroform, To the solution was added methanol to obtain 0.1 g of Compound (1-3) as yellow solid.

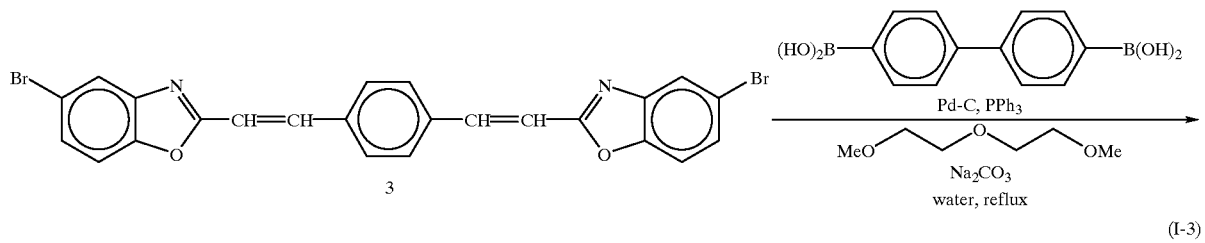

EXAMPLE 3

Synthesis of Compound (1-7)

To a mixture of 0.77 g of dibromo derivative (Compound (5) shown below) and 0.2 g of 4,4'-biphenyldiboric acid (Compound (4) shown below) were added 6 ml of diethyleneglycol dimethyl ether, 2.5 ml of water, 0.03 g of triphenyl phosphine, 0.5 g of sodium carbonate and 0.1 g of palladium carbon and the solution was refluxed by heating for 12 hours with stirring. To the reaction mixture were added 100 ml of ethyl acetate and 50 ml of aqueous hydrochloric acid (1N), and the organic layer separated was washed with water and then a saturated aqueous sodium chloride! solution and concentrated. The residue was purified by column chromatography (developer: ethyl acetate) to obtain 0.3 g of Compound (1-7) as yellow crystals.

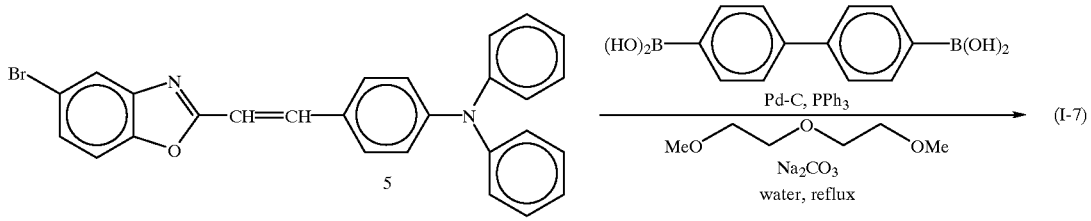

EXAMPLES 4 TO 7 AND COMPARATIVE EXAMPLE 1

Preparation of EL Element and Evaluation

In 3 ml of dichloroethane were dissolved 40 mg of polyvinyl carbazole, 12 mg of PBD (p-tert-butylphenyl biphenyl oxadiazole) and 1 mg of TPB (tetraphenylbutadiene) and the solution was spin-coating on a cleaned ITO substrate. The thickness of the organic thin layer formed was about 120 nm. A patterned mask (having a luminescent area of 5 mm×5 mm) was provided on the organic thin layer and in a vapor deposition apparatus, magnesium and silver were simultaneously vapor-deposited in a magnesium/silver ration of 10/1 so as to result. in a thickness of 50 nm and then silver was vapor-deposited so as to result in a thickness of 50 nm.

A direct current constant-voltage was applied to the resulting EL element using a source measure unit (Type 2400 manufactured by Toyo Technica Co., Ltd.) to emit luminescence, and a luminance of the luminescence and a wavelength thereof were measured using a luminance meter (BM-8 manufactured by Topcon Corp.) and a spectrum analyzer (PMA-11 manufactured by Hamamatsu Photonics K.K.), respectively. As a result, the maximum luminance of 280 cd/m$^2$ was obtained at 12 V. The λmax of the luminescence was 450 nm. The EL element was allowed to stand for 5 hours and subjected to emission. The generation of the dark spot was visually observed on the luminescent surface. The generation of the dark spot indicated that the EL element degraded.

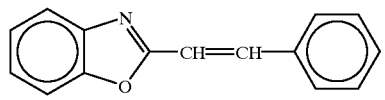

Compound A

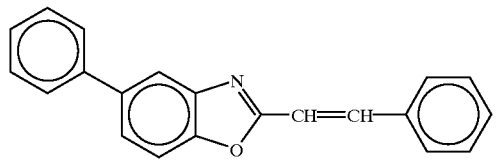

Compound B

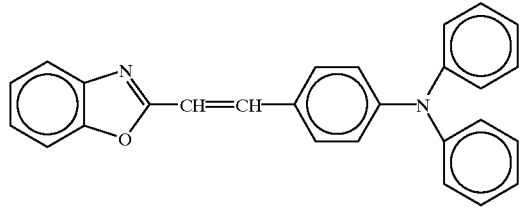

Compound C

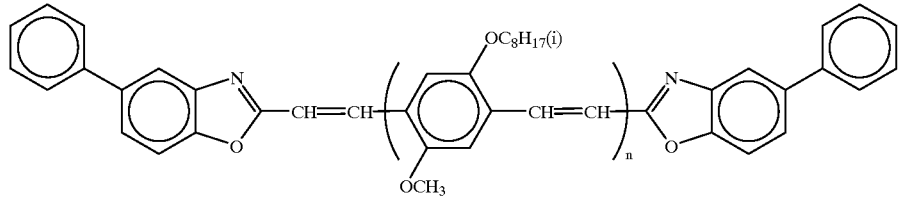

Compound D

COMPARATIVE EXAMPLE 2

On a cleaned ITO substrate in a vapor deposition apparatus, α-TPD (N,N'-diphenyl-di(m-tolyl)benzidine) was vapor-deposited so as to result in a thickness of 40 nm, and Compound A was vapor-deposited so as to result in a thickness of 10 nm. Then, Alq3 (Al-oxine) was vapor-deposited thereon so as to result in a thickness of 40 nm. A patternedmask was provided on the organic thin layer, and in a vapor deposition apparatus, magnesium and silver were simultaneously vapor-deposited in a magnesium/silver ratio of 10/1 so as to result in a thickness of 50 nm and then silver was vapor-deposited so as to result in a thickness of 50 nm.

This sample was subjected to the same evaluation as in Comparative Example 1. A lot of dark areas were observed on the luminescent surface.

COMPARATIVE EXAMPLE 3

The same preparation procedure and evaluation as in. Comparative Example 2 were carried out except that Compound E; was used in place of Compound A. A lot of dark areas were observed on the luminescent surface.

COMPARATIVE EXAMPLE 4

The same preparation procedure and evaluation as in Comparative Example 2 were carried out except that Compound C was used in place of Compound A. Luminescence of 5700 cd/m$^2$ was obtained at 11 V. The λmax of the luminescence ($EL_{max}$) was 490 nm. When the sample was allowed to stand at a room temperature under a nitrogen atmosphere for one day, a lot of dark spots were observed on the luminescent surface.

COMPARATIVE EXAMPLE 5

Compound D (40 mg) was dissolved in 2.5 ml of dichloroethane, and the solution was spin-coating on a cleaned ITO substrate. The thickness of the organic thin layer formed was about 100 nm. When the same cathode preparation and element evaluation were carried out in the same manner as in Comparative Example 1, luminescence of red-orange color was obtained from the element.

EXAMPLES 4 TO 7

In place of tetraphenylbutadiene used in Comparative Example 1, the styryl compound according to the present invention shown in Table below was employed to conduct the same procedure described in Comparative Example 1. The results obtained are shown in Table 1 below.

TABLE 1

Luminescent Characteristics of EL Element

| Example | Compound | Luminance of Luminescence (cd/m$^2$) | Driving Voltage (V) | Wavelength of Luminescence (nm) | Generation of Dark Spot* |
|---|---|---|---|---|---|
| 4 | 1-1 | 914 | 17 | 470 | B |
| 5 | 1-2 | 852 | 17 | 480 | A |
| 6 | 1-3 | 740 | 19 | 460 | A |
| 7 | 1-7 | 628 | 17 | 480 | B |
| Comparison | TPB | 280 | 12 | 450 | C |

*A: Dark spot was not visually observed.
B: A small amount of dark spots was visually observed.
C: Many dark spots were visually observed.

EXAMPLE 8

In place of Compound A used in Comparative Example 2, pound (1-1) according to the present invention was employed, duct the same element preparation and evaluation described. parative Example 2. Luminescence of 7200 cd/m$^2$ was obtained at 9 V. The λmax of the luminescence ($EL_{max}$) was 485 nm. When the sample was allowed to stand at a room temperature under a nitrogen atmosphere for one day, only a few dark spots were observed on the luminescent surface.

EXAMPLE 9

In place of Compound D used in Comparative Example 5, the compound (1-13) according to the present invention was employed to conduct the same element preparation and evaluation described in Comparative Example 5. Luminescence of blue-green color was obtained from the element.

As described above, EL elements which emit luminescence of the desired wavelength in a blue to blue-green region and have the excellent luminance of luminescence without visual observation of dark spot are obtained using the styryl compound according to the present invention.

The organic EL element comprising the styryl compound according to the present invention has excellent luminescent characteristics and durability.

While the invention has been described in detail and with reference to specific embodiments thereof, it will be apparent to one skilled in the art that various changes and modifications can be made therein without departing from the spirit and scope thereof.

What is claimed is:
1. An electroluminescent element comprising at least one compound containing at least one unit represented by formula (1):

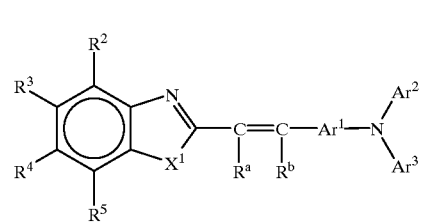

(1)

wherein $X^1$ represents an oxygen atom, an sulfur atom or >NR$^6$; R$^2$, R$^3$, R$^4$, R$^5$ and R$^6$, which are the same or different, each represents a hydrogen atom or a substituent, provided that at least one of R$^2$, R$^3$, R$^4$ and R$^5$ represents an aromatic group; R$^a$ and R$^b$, which are the same or different, each represents a hydrogen atom or a substituent; Ar$^1$ represents an aromatic linking group; and Ar$^2$ and Ar$^3$ each represents an aromatic group.

2. An electroluminescent element as claimed in claim 1, wherein R$^3$ is an aryl group, and R$^a$ and R$^b$ each represents a hydrogen atom.

3. An electroluminescent element as claimed in claim 1, wherein R$^4$ is an aryl group, and R$^a$ and R$^b$ each represents a hydrogen atom.

4. A high molecular weight compound comprising a partial skeleton represented by formula (2) in the polymer main chain:

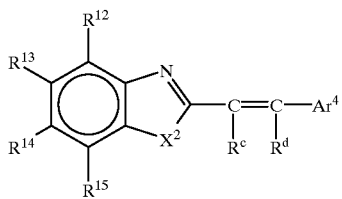

(2)

wherein $X^2$ represents an oxygen atom, a sulfur atom or $>NR^{16}$; $R^{12}$, $R^{13}$, $R^{14}$, $R^{15}$ and $R^{16}$, which are the same or different, each represents a hydrogen atom or a substituent, provided that at least one of $R^{12}$, $R^{13}$, $R^{14}$, $R^{15}$ and $R^{16}$ represents an aromatic group; $R^c$ and $R^d$, which are the same or different, each represents a hydrogen atom or a substituent; and $Ar^4$ represents an aromatic group.

5. An electroluminescent element comprising at least one high molecular weight compound comprising a partial skeleton represented by formula (2) in the polymer main chain, as claimed in claim 4.

6. An electroluminescent element as claimed in claim 1, which is non-doped type.

7. An electroluminescent element as claimed in claim 2, which is non-doped type.

8. An electroluminescent element as claimed in claim 3, which is non-doped type.

9. An electroluminescent element as claimed in claim 5, which is non-dope type.

* * * * *